United States Patent
Desrosiers

(10) Patent No.: US 12,422,512 B2
(45) Date of Patent: Sep. 23, 2025

(54) AGING COMPENSATION FOR POLY-RESISTOR BASED CURRENT SENSE AMPLIFIER

(71) Applicant: Avago Technologies International Sales Pte. Limited, Singapore (SG)

(72) Inventor: Ryan Desrosiers, Fort Collins, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 733 days.

(21) Appl. No.: 17/849,184

(22) Filed: Jun. 24, 2022

(65) Prior Publication Data

US 2023/0417854 A1    Dec. 28, 2023

(51) Int. Cl.
| | |
|---|---|
| H02J 7/00 | (2006.01) |
| G01R 19/25 | (2006.01) |
| G01R 35/00 | (2006.01) |
| H02J 50/10 | (2016.01) |
| H03F 3/45 | (2006.01) |

(52) U.S. Cl.
CPC .......... G01R 35/005 (2013.01); G01R 19/25 (2013.01); H02J 50/10 (2016.02); H03F 3/45475 (2013.01); *H03F 2200/462* (2013.01)

(58) Field of Classification Search
None
See application file for complete search history.

(56) References Cited

U.S. PATENT DOCUMENTS

| | | | |
|---|---|---|---|
| 6,628,216 B2 | 9/2003 | Chen et al. | |
| 7,758,240 B2 | 7/2010 | Júlio et al. | |
| 8,779,777 B2 | 7/2014 | Irmer et al. | |
| 9,176,484 B2 | 11/2015 | Kanzaki et al. | |
| 9,342,400 B2 | 5/2016 | Nabhane et al. | |
| 9,373,381 B2 | 6/2016 | Lee | |
| 9,563,213 B2 | 2/2017 | Addepalli et al. | |
| 10,250,266 B2 | 4/2019 | Annema et al. | |
| 11,162,990 B2 | 11/2021 | Nakamura | |
| 2006/0290387 A1 | 12/2006 | Gossmann et al. | |
| 2008/0061873 A1* | 3/2008 | Hughes | H03G 1/0088 330/86 |
| 2008/0068106 A1* | 3/2008 | Alford | H03B 5/36 331/158 |

(Continued)

FOREIGN PATENT DOCUMENTS

CN    102269776 B    10/2014

*Primary Examiner* — Arun C Williams
(74) *Attorney, Agent, or Firm* — Quarles & Brady LLP

(57) ABSTRACT

A wireless power system is described. The wireless power system includes a coil for receiving and transmitting wireless power, an integrated circuit, and one or more batteries. The integrated circuit includes a rectifier circuit, a current sense amplifier circuit, a calibration circuit, and a voltage regulator. The rectifier circuit receives alternating current from the coil and generates a rectified voltage when the wireless power system is in receive mode and further transmits alternating current to the coil when the wireless power system is in transmit mode. The current sense amplifier circuit detects a current flowing between the rectifier and the voltage regulator. The calibration circuit generates a voltage which is used by firmware of the integrated circuit to calibrate for aging of resistors within the current sense amplifier circuit.

20 Claims, 5 Drawing Sheets

(56) References Cited

U.S. PATENT DOCUMENTS

| | | | |
|---|---|---|---|
| 2011/0298473 A1* | 12/2011 | Irmer | G01R 19/0092 |
| | | | 324/601 |
| 2014/0184199 A1* | 7/2014 | Mueller | G01R 1/203 |
| | | | 324/126 |
| 2016/0049807 A1 | 2/2016 | Thompson et al. | |
| 2021/0383844 A1 | 12/2021 | Antonyan | |

* cited by examiner

AGING COMPENSATION FOR POLY-RESISTOR BASED CURRENT SENSE AMPLIFIER

TECHNICAL FIELD

The present invention generally relates to circuitry, and more specifically to circuitry for measuring current.

BACKGROUND

Current sensing is one block in wireless power systems. The sensed current together with the voltage measurement provide a power measurement of the system. The power measurement is critical for understanding how much power is actually being received from the transmitter and delivered to a load, such as a battery. In particular, wireless power systems have to measure power very accurately to help with foreign object detection. Undesirably, a foreign object may receive power from a transmitter and begin overheating. The receiver may include a current sensing functionality to measure the power received for determining the power lost to the foreign object. Power losses due to foreign objects may be predicted by more accurately determining the current received. Thus, it is desirable to determine the current received to a given level of accuracy. However, the current sensing function of the wireless power system may include inaccuracies introduced by one or more sources.

In particular, many known current sensing systems include resistors comprising polysilicon known to be subject to increases in resistance values due to aging. The increase in resistance can be as high as 1.5 percent over a 10-year period. Thus, the aging makes it difficult for the known current sensing systems to meet a given accuracy specification.

In view of the above, one or more embodiments of the present disclosure provide an integrated circuit including an improved current sense capability.

SUMMARY

An integrated circuit is described, in accordance with one or more embodiments of the present disclosure. In some embodiments, the integrated circuit includes a current sense circuit including a first amplifier, a first resistor, a second resistor, a third resistor, a fourth resistor, and a fifth resistor. In some embodiments, the first resistor includes a first resistance (Rs), the second resistor and the third resistor each include a second resistance (Rt), and the fourth resistor and the fifth resistor each include a third resistance (Rb). In some embodiments, the first resistor is configured to carry a first current (Isns) which is based on the first resistance (Rs) and a voltage differential between a first voltage (Vrect) and a second voltage (Vmid). In some embodiments, the first amplifier is configured to output a third voltage (Vo) based of the current (Isns). In some embodiments, a gain of the first amplifier is based on the second resistance (Rt) and the third resistance (Rb). In some embodiments, at least the fourth resistor and the fifth resistor are comprised of a polysilicon material. In some embodiments, the third resistance (Rb) increases with aging of the fourth resistor and the fifth resistor. In some embodiments, the integrated circuit includes a calibration circuit including a sixth resistor comprised of the polysilicon material. In some embodiments, the sixth resistor includes the third resistance (Rb). In some embodiments, the calibration circuit is configured to output a fourth voltage (Vcal) which is proportional to the third resistance (Rb). In some embodiments, the integrated circuit includes a processor. In some embodiments, the processor is configured to receive one or more digital signals of the third voltage (Vo) and the fourth voltage (Vcal). In some embodiments, the processor is configured determine the current (Isns) based on the third voltage (Vo). In some embodiments, the processor is configured to calibrate for the aging of the fourth resistor and the fifth resistor based on the fourth voltage (Vcal) when determining the first current (Isns).

A wireless power system is described, in accordance with one or more embodiments of the present disclosure. In some embodiments, the wireless power system includes a coil. In some embodiments, the wireless power system includes an integrated circuit. In some embodiments, the integrated circuit includes a rectifier circuit configured to receive alternating current from the coil and generate a first voltage (Vrect). In some embodiments, the integrated circuit includes a current sense circuit including a first amplifier, a first resistor, a second resistor, a third resistor, a fourth resistor, and a fifth resistor. In some embodiments, the first resistor includes a first resistance (Rs), the second resistor and the third resistor each include a second resistance (Rt), and the fourth resistor and the fifth resistor each include a third resistance (Rb). In some embodiments, the first resistor is configured to carry a first current (Isns) which is based on the first resistance (Rs) and a voltage differential between a first voltage (Vrect) and a second voltage (Vmid). In some embodiments, the first amplifier is configured to output a third voltage (Vo) based of the current (Isns); wherein a gain of the first amplifier is based on the second resistance (Rt) and the third resistance (Rb). In some embodiments, at least the fourth resistor and the fifth resistor are comprised of a polysilicon material. In some embodiments, the third resistance (Rb) increases with aging of the fourth resistor and the fifth resistor. In some embodiments, the integrated circuit includes a voltage regulator circuit configured to regulate the second voltage (Vmid). In some embodiments, the integrated circuit includes a calibration circuit including a sixth resistor comprised of the polysilicon material. In some embodiments, the sixth resistor includes the third resistance (Rb). In some embodiments, the calibration circuit is configured to output a fourth voltage (Vcal) which is proportional to the third resistance (Rb). In some embodiments, the integrated circuit includes a processor. In some embodiments, the processor is configured to receive one or more digital signals of the third voltage (Vo) and the fourth voltage (Vcal). In some embodiments, the processor is configured determine the current (Isns) based on the third voltage (Vo). In some embodiments, the processor is configured to calibrate for the aging of the fourth resistor and the fifth resistor based on the fourth voltage (Vcal) when determining the first current (Isns). In some embodiments, the wireless power system includes a passive element disposed external to the integrated circuit and coupled to the pin; wherein the passive element is coupled between the pin and ground. In some embodiments, the wireless power system includes a battery charging system.

A calibration circuit is described, in accordance with one or more illustrative embodiments. In some embodiments, the calibration circuit includes a pin. In some embodiments, the calibration circuit includes a passive element coupled to the pin; wherein the passive element is coupled between the pin and a ground. In some embodiments, the calibration circuit includes a first resistor comprising a polysilicon material. In some embodiments, the first resistor includes a first resistance (Rb) which increases with aging of the polysilicon material. In some embodiments, the calibration circuit includes an amplifier configured to receive a bandgap voltage (Vbg) and generate a current (Ical) across the passive element. In some embodiments, the calibration circuit is further configured to mirror the current (Ical) across the first resistor. In some embodiments, the calibration circuit is configured to output a first voltage (Vcal) which is based on the bandgap voltage (Vbg), the first resistance (Rb), and the passive element.

BRIEF DESCRIPTION OF THE DRAWINGS

Implementations of the concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF THE INVENTION

Figure 1A:
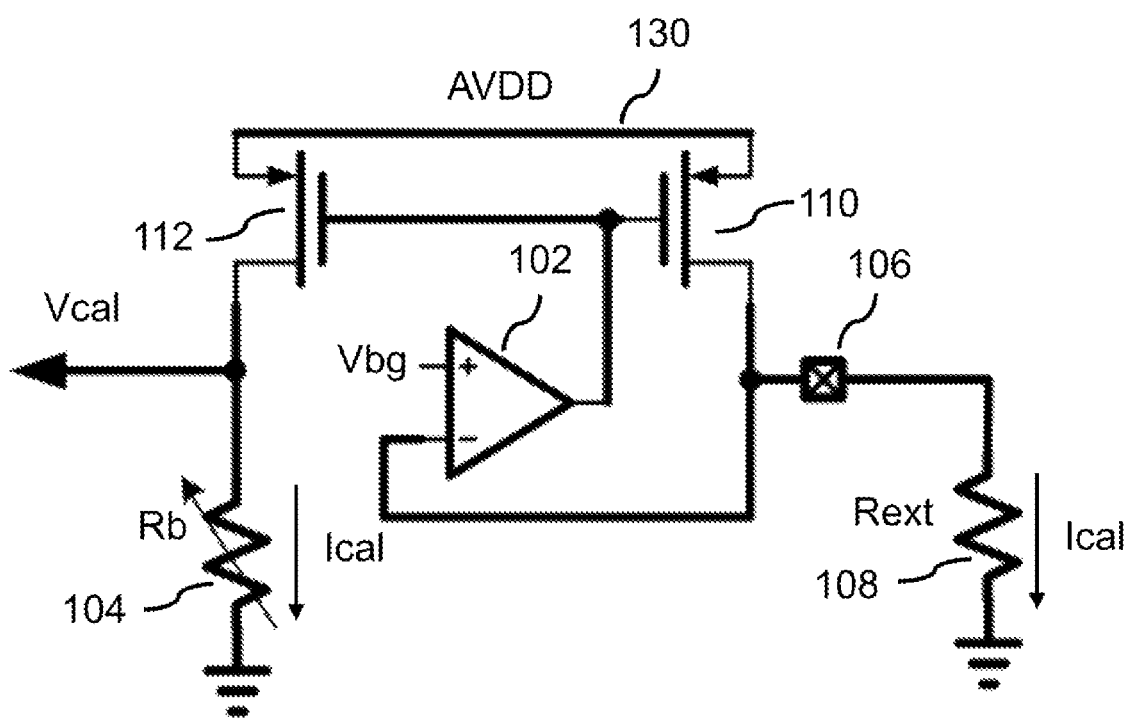
FIG. 1A depicts a calibration circuit, in accordance with one or more embodiments of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details are set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Reference will now be made in detail to the subject matter disclosed, which is illustrated in the accompanying drawings.

Polysilicon in semiconductor integrated circuits (IC) is subject to increases in resistance values due to aging. The increase in resistance can be as high as 1.5 percent over a 10-year period. For current sense amplifiers using polysilicon resistors as the sense element, this aging increase over time results in a gain error equal to the magnitude of the aging. Thus, the aging makes it difficult for the current sense amplifier to meet a given accuracy specification.

Embodiments of the present disclosure are generally directed to compensating for aging of one or more resistors in a current sense circuit by calibration. The current sense circuit is internal to an integrated circuit and includes one or more polysilicon resistor elements which are sensitive to aging. To calibrate for the aging, a calibration circuit is employed. The calibration circuit includes polysilicon resistor elements which match the polysilicon resistor elements used in the current sense circuit and which are equally subject to changes due to aging. The calibration circuit may further include an external passive element with a high precision, such as an external resistor or an external capacitor. The calibration circuit and the current sense circuit may be assembled into the integrated circuit. Once assembled, internal current may be applied to the calibration circuit and a voltage may be converted to a digital signal with an analog-to-digital converter (ADC). The digital signal may then be provided to a processor. This voltage may be stored in non-volatile memory within the integrated circuit. The processor of the integrated circuit may periodically measure the digital signal from the ADC and compare the current voltage reading to the initial voltage reading. The processor may then calibrate a current sense reading based on the change in voltage. This may allow accounting for the fact that the polysilicon resistor elements change due to aging. For example, if the processor detects that a resistance value for the polysilicon resistor elements have increased by 1% due to aging, then the current sense readings from the current sense circuit are reduced by 1% to calibrate via firmware maintained on the memory. In embodiments, the calibration circuit may be provided for one or more resistors between an output of an operational amplifier of the current sense circuit and a ground. Advantageously, the calibrated value from the current sense circuit may allow for a current reading to be achieved within a given tolerance. In embodiments, the integrated circuit is a wireless power integrated circuit for a wireless power system, although this is not intended to be limiting. By calibrating for the aging, the wireless power integrated circuit may achieve an accuracy of 1% or better when using an internal poly-resistance sensing element.

Figure 1B:
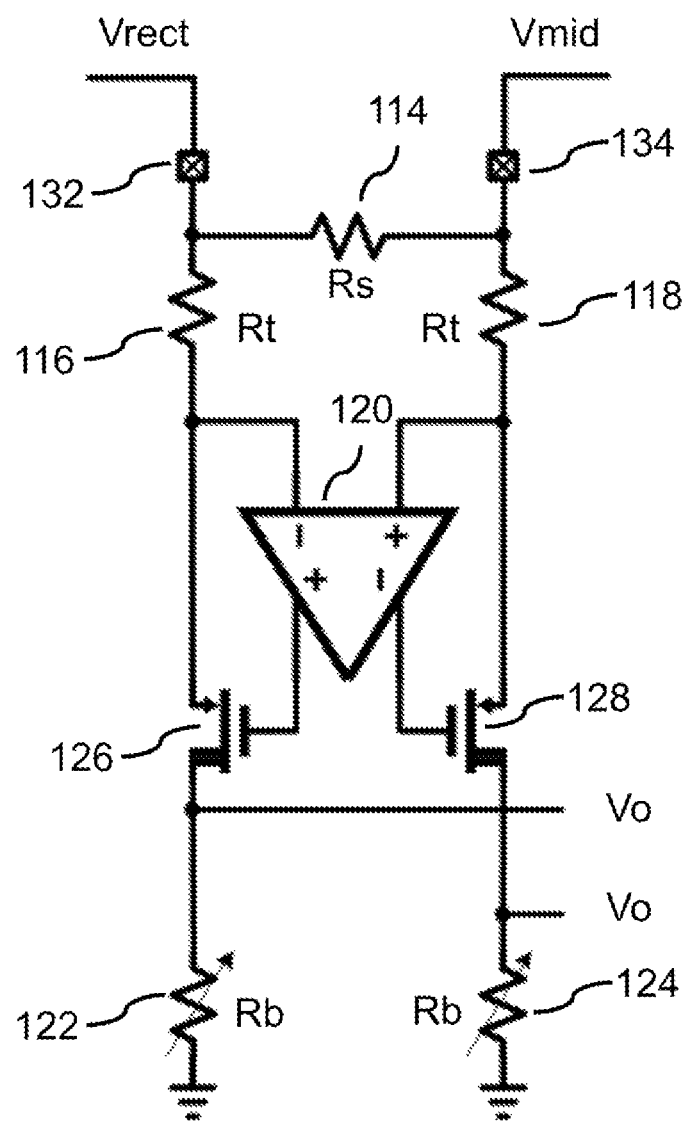
FIG. 1B depicts a current sense circuit, in accordance with one or more embodiments of the present disclosure.

Referring generally to FIGS. 1A and 1B, a current sense circuit 103 and a calibration circuit 101 for the current sense circuit 103 are now described. A current sensed by the current sense circuit 103 may be calibrated for by the calibration circuit 101. The current sense circuit may be configured to measure current across a wide range of voltages, such as up to 24 volts, or more. The current sense circuit 103 may be configured to measure current with a relatively large dynamic range, such as, but not limited to, between 1 milli-amp up to 2.5 amps, or more. The accuracy of the current sense circuit 103 has been experimentally determined to be within 0.5 percent of the actual current across the dynamic range of currents by performing aging calibration with the calibration circuit 101. It is further contemplated that advances in the current sense circuit 103 together with various additional components may cause the current sense circuit 103 to include an accuracy of within 0.5 percent of the actual current across the dynamic range of currents, although this is not intended to be limiting. Although the current sense circuit 103 and the calibration circuit 101 are depicted as including the various components contained in the respective arrangements, this is not intended as a limitation of the present disclosure. It is further contemplated that the current sense circuit 103 and the calibration circuit 101 may include various additional components which are not depicted. It is noted herein "coupled" may mean one or more of "communicatively coupled to," "electrically coupled to," and/or "physically coupled to," for purposes of the present disclosure. As used herein, coupled may refer to a direct or indirect coupling. An indirect coupling may refer to a connection via another functional element. A direct coupling may refer to a connection without intermediary functional elements. It is noted herein that by being "coupled between", it may be understood to be relative to movement or flow of the signal between two more components, and may additionally include intervening components therein.

Referring now to FIG. 1A, the calibration circuit 101 is described. The calibration circuit 101 may also be referred to as an aging calibration circuit, a polysilicon resistor aging calibration circuit, or an external circuit. The calibration circuit 101 may provide a structure that tracks a shift in resistance values for polysilicon resistor elements due to aging. The calibration circuit 101 may be configured to generate a voltage (Vcal). The voltage (Vcal) may be provided to an analog-to-digital converter which generates a digital signal. The digital signal may then be used for calibrating an error due to aging or temperature of one or more resistors of the current sense circuit 103. The calibration circuit 101 may include one or more components for generating the voltage (Vcal). For example, the calibration circuit 101 may include an amplifier 102, a resistor 104, a pin 106, an external passive element 108, a transistor 110, and a transistor 112.

The pin 106 may generally include any pin suitable for use in integrated circuits. The pin 106 may also be referred to as a pinout or a chip pin. The external passive element 108 may be coupled between the pin 106 and a ground. The external passive element 108 may be coupled to an integrated circuit 200 including the calibration circuit 101 by the pin 106, such that the element may be considered "external". The use of the external passive element 108 may be advantageous for including a passive element (e.g., resistor, capacitor) with a very low temperature and aging coefficient. In this regard, the external passive element 108 may be considered a precision passive element having less than 0.1 percent change due to aging. For example, the external passive element 108 may include a 0.135% increase after 2.2 years, although this is not intended to be limiting. By way of another example, the external passive element 108 may include a temperature coefficient (TC) of 10 PPM/C, although this is not intended to be limiting.

In embodiments, the external passive element 108 may be a resistor, such as, but not limited to, a thin film chip resistor. The resistor may be formed of a material with a very low temperature coefficient and a very low aging coefficient, such as a nichrome material. For example, the temperature coefficient and the aging coefficient of the nichrome material may each be proximate to zero. The resistor may also include a known resistance value, such as, but not limited to, a resistance value of 10 kilo-ohms (10KΩ). In embodiments, the external passive element 108 may be a capacitor. The capacitor may similarly include a material with a very low temperature coefficient and a very low aging coefficient. The capacitor may also include a known capacitance value, such as, but not limited to, 10 microfarads (10 μF).

The amplifier 102 may generally include any amplifier, such as, but not limited to, an operational amplifier. The operational amplifier 102 may drive the bandgap voltage (Vbg) on the pin 106 and similarly the external passive element 108. For example, the operational amplifier 102 may be configured to drive the bandgap voltage (Vbg) of 1.25 volts on the pin 106. The voltage on the pin 106 may then generate a current (Ical) across the external passive element 108. Where the external passive element 108 is a resistor, the current (Ical) may be the bandgap voltage (Vbg) at the pin 106 divided by the resistance value. For example, the current (Ical) may be 0.125 milliamps as determined by 1.25 volts divided by 10KΩ, although this is not intended to be limiting. It is further contemplated that any number of voltages and resistance values may be used, and similarly the current (Ical) may include a range of values. The current (Ical) may thus be a known value which is relatively independent to aging and temperature. The current (Ical) may be stored in memory.

The resistor 104 may be coupled between a node and a ground. The node may be a point connecting between one or more elements of a circuit and/or between one or more branches of a circuit. The node may be represented by a wire connecting the various elements and/or branches. The resistor 104 may be included within the integrated circuit 200, such that the resistor 104 may be considered "internal". The resistor 104 may include a resistance value (Rb). The resistor 104 may be formed of one or more polysilicon elements which define the resistance value (Rb). The resistor 104 may be designed such that the resistance value (Rb) matches a resistance value (Rb) of one or more resistors (e.g., resistor 122, resistor 124) in the current sense circuit 103. For example, the resistor 104 may be designed with matching physical dimensions (e.g., width, length) and/or number of polysilicon resistor elements to achieving the matching resistance. The resistor 104 may be placed in a same layer as the resistor 122 and the resistor 124. The resistor 104 may be placed in an interdigitated configuration with resistor 122 and 124. By matching the resistance value (Rb), the resistor 104 may include a similar temperature coefficient and/or a similar aging coefficient to the matched resistors present within the current sense circuit 103. As depicted, the resistor 104 may be a variable resistor, although this is not intended to be limiting.

The calibration circuit 101 may further be configured to mirror the current (Ical) across the resistor 104. Mirroring current may refer to copying a current from a first element across a second element and keeping the output current constant without regard to loading. The calibration circuit 101 may generally include any suitable structure to mirror the current (Ical) across the resistor 104 and the external passive element 108. For example, the calibration circuit 101 may include the transistor 110 and the transistor 112 for mirroring the current (Ical). The transistor 110 may be coupled between an output of the operational amplifier 102, the pin 106, and a power supply 130. The power supply 130 may be an analog power supply voltage (AVDD). Similarly, the transistor 112 may be coupled between the output of the operational amplifier 102, a node of the resistor 104, and a power supply 130. As may be understood, the transistor 110 and the transistor 112 may generally include any transistor, such as, but not limited to, a field-effect transistor such as a metal-oxide-semiconductor field-effect transistor (MOSFET or M). Where the transistor 110 and the transistor 112 include MOSFETS, the calibration circuit 101 may be considered to include a MOSFET current mirror. As depicted, the transistor 110 and the transistor 112 may be a P-channel MOS (PMOS), although this is not intended to be limiting.

By mirroring the current (Ical) across the resistor 104, the node coupled to the external passive element 108 may include a voltage (Vcal). The voltage (Vcal) may thus be dependent upon the one or more factors. The voltage (Vcal) may be proportional to the bandgap voltage (Vbg), the resistance value (Rb), and an error coefficient of the resistor 104 (e.g., error due to temperature and/or aging). Where the external passive element 108 is a resistor, the voltage (Vcal) may also be inversely proportional to the resistance (Rext). For example, an equation for the voltage (Vcal) is provided below:

$$Vcal = \frac{Vbg * Rb * (1 + TC(Rb) + \text{Age}(Rb))}{Rext}$$

The node may output the voltage (Vcal) to an analog-to-digital converter (ADC), which is not depicted in FIG. 1A. The voltage (Vcal) at the node may thus be output from the calibration circuit 101 to an ADC for allowing one or more processors to determine the error coefficient for the resistor 104, based on one or more digital signals corresponding to the change in the voltage (Vcal) and similarly a change in the resistance (Rb) due to one or more of temperature or aging. For example, the voltage (Vcal) may increase due to an increase in the resistance (Rb) due to aging. Advantageously, the error coefficient may be the same as an error coefficient in the resistor 122 or the resistor 124 of the current sense circuit 103. Thus, the voltage (Vcal) generated by the calibration circuit 101 may include the same percent error over temperature and over aging as the current sense circuit 103. The processor may then calibrate for the aging of the downstairs resistors of the current sense circuit when determining the current (Isns).

Although the calibration circuit 101 is described as including the external passive element 108, this is not intended as a limitation of the present disclosure. Where the calibration circuit 101 is included in an integrated circuit, the calibration circuit 101 may not include the external passive element 108. Instead, the external passive element 108 may be coupled to the calibration circuit by the pin 106. For example, the integrated circuit may be formed during one or more fabrication steps. The external passive element 108 may then be coupled to integrated circuit in a later assembly step, such as when the integrated circuit is installed in a communication device.

Referring now to FIG. 1B, the current sense circuit 103 is described. The current sense circuit 103 may provide a structure that measures a current across a resistor. The current may be measured with a select level of accuracy and across a wide range of current values. The current sense circuit 103 may be configured to output a voltage (Vo). The voltage (Vo) may be provided to an analog-to-digital converter which generates a digital signal which may then used by a processor to determine a current (Isns). The current sense circuit 103 may include one or more components for generating the voltage (Vo). For example, the current sense circuit 103 may include a resistor 114, a resistor 116, a resistor 118, an amplifier 120, a resistor 122, a resistor 124, a transistor 126, and a transistor 128.

The resistor 114 may be coupled between a node with a first voltage (Vrect) and a node with a voltage (Vmid). The resistor 114 may include a resistance (Rs). The resistance (Rs) may include a relatively small resistance value. The resistance (Rs) may be relatively small to reduce the amount of power dissipated across the resistor 114, due to the inversely proportional relationship between resistance and power loss. For example, the resistor 114 may be a 20 milli-Ohm resistor, although this is not intended to be limiting. A range of values for the resistor 114 are contemplated around the exemplary 20 milli-Ohm resistor. In this regard, the resistance value may be selected to be on the order of 1 to 100 milli-Ohm, or greater. The resistor 114 may be configured to carry the current (Isns) across the resistor which may be based on the resistance (Rs) and a voltage differential between the voltage (Vrect) and the voltage (Vmid). Providing the low resistance resistor makes for challenges in circuit designs, particularly with reductions in the resistance (Rs) and when measuring currents across a wide and dynamic range (e.g., between the milli-amp range to a 2.5-amp range). A number of challenges exist for integrating the resistor 114 into the integrated circuit (IC).

In embodiments, the current sense circuit 103 is designed to output the voltage (Vo) for sensing the current (Isns). In this regard, the ability to detect the current (Isns) may be advantageous for sensing a received or transmitted power. Due to the desire to detect the current (Isns) across the resistor 114, the resistor 114 may also be referred to as a sense resistor.

The resistor 116 may be coupled between the node having the voltage (Vrect) and an input of the amplifier 120. Similarly, the resistor 118 may be coupled between the node having the voltage (Vmid) and an input of the amplifier 120. In this regard, the resistor 116 and the resistor 118 may also be referred to herein as upstairs resistors or input resistors for the amplifier 120. In embodiments, the resistor 116 and the resistor 118 each include a resistance value (Rt) which is matched. In this regard, the resistor 116 and the resistor 118 may also be referred to herein as a first pair of matched resistors. The resistance (Rt) may increase with aging of the resistor 116 and the resistor 118.

The resistor 122 may be coupled between an output of the amplifier 120 and a ground. Similarly, the resistor 124 may be coupled between an output of the amplifier 120 and a ground. For example, the resistor 122 is depicted as being coupled between a node of the transistor 126 and ground, and the resistor 124 is depicted as being coupled between a node of the transistor 128 and ground. In this regard, the resistor 122 and the resistor 124 may also be referred to herein as downstairs resistors for the amplifier 120. In embodiments, the resistor 122 and the resistor 124 each include a resistance value (Rb) which is matched. In this regard, the resistor 122 and the resistor 124 may also be referred to herein as a second pair of matched resistors. By the arrangement of the resistor 122 and the resistor 124, the voltage (Vo) output from the current sense circuit 103 is proportional to the resistance (Rb). As depicted, the resistor 122 and the resistor 124 may be a variable resistor, although this is not intended to be limiting.

The amplifier 120 may be configured to output the voltage (Vo). The amplifier 120 may output the voltage (Vo) by amplifying a voltage drop across the resistor 114 and may be based on the current (Isns). The amplifier 120 may also be referred to as an operational amplifier, a differential amplifier, or a high gain amplifier. The amplifier 120 may sense the input voltage on the upstairs resistors and drive the outputs so that the voltage from the left side and the right side is equal. Driving the outputs to be equal may thereby guarantee a current that is proportional to the current (Isns). The amplifier 120 may include a gain which is based on the resistance (Rb) for the downstairs resistors divided by the resistance (Rt) of the upstairs resistors. For example, the resistance (Rt) for the upstairs resistors may be 1 kilo-ohm (1KΩ resistor), although this is not intended to be limiting. Continuing the example, the resistance (Rb) for the downstairs resistors may be 17.5 kilo-ohms (17.5KΩ resistor), although this is not intended to be limiting. Where the upstairs resistors are 1KΩ resistors and the downstairs resistors are 17.5KΩ resistors, the gain of the amplifier may be a factor of 17.5 (e.g., a gain of approximately 24.86 dB), although this is not intended to be limiting. In some instances, the gain for the amplifier 120 may be selected based on a capability of a downstream ADC.

In embodiments, each of the resistor 114, the resistor 116, the resistor 118, the resistor 122, and the resistor 124 are included within the integrated circuit 200, such that the resistors may be considered "internal". Each of the resistors may be formed of one or more polysilicon elements which define the resistance value (Rs), the resistance value (Rt), and the resistance value (Rb). The resistor 122 and the resistor 124 may be designed such that the resistance value (Rb) matches a resistance value (Rb) of the resistor 104 in the calibration circuit 101. For example, the resistors may be designed with matching physical dimensions (e.g., width, length) and/or number of polysilicon resistor elements to achieving the matching resistance. By matching the resistance value (Rb), the resistor 122, the resistor 124, and the resistor 104 may include a similar temperature coefficient and a similar aging coefficient. It is further contemplated that the resistor 114, the resistor 116, and the resistor 118 may include a substantially similar temperature coefficient and a similar aging coefficient via proper matching techniques described herein.

In embodiments, the resistor 114 is an internal resistor. The current sense circuit may sense the current internally without using an external component, such as an external sense resistor. The resistor 114 being part of the integrated circuit, including a relatively low resistance value, and measuring a large dynamic range of currents may provide challenges with designing the current sense circuit 103. In embodiments, the resistor 114 is a precision resistor which is provided within the integrated circuit on the chip and is combined with the amplifier 120 to form the current sense circuit 103. The current measured across the resistor 114 may be referred to herein as sensed current (Isns) and may be based on the resistance value of the sense resistor (Rs) and the voltage drop between the rectified voltage (Vrect) and the middle voltage (Vmid).

As depicted in FIG. 1B, the current sense circuit 103 includes a pin 132 coupled to the node between the resistor 114 and the resistor 116. The pin 132 may be provided for routing the voltage (Vrect) to and from a rectifier, although this is not intended to be limiting. The current sense circuit 103 may also include a pin 134 coupled to the node between the resistor 114 and the resistor 116. The pin 134 may be provided for routing the voltage (Vmid) to and from a voltage regulator, although this is not intended to be limiting.

In embodiments, the resistor 114 is assembled into an integrated circuit with the amplifier 120. The upstairs resistors (e.g., the resistor 116, the resistor 118) and the downstairs resistors (e.g., the resistor 122, the resistor 124) may also be part of the integrated circuit. By merging the amplifier components with the resistor 114 onto the integrated circuit, the temperature coefficient and aging of the resistor 114 and the upstairs resistors may be substantially similar. In embodiments, an integrated circuit includes the upstairs resistors and the current sense resistors which are integrated into a layout.

In embodiments, one or more of the resistor 114, the resistor 116, the resistor 118, the resistor 122, or the resistor 124 comprises a polysilicon resistor formed onto the integrated circuit below a metallization layer. The polysilicon resistor may also be referred to herein as a poly resistor or an internal poly resistor. In embodiments, the polysilicon resistor is formed as an array of polysilicon elements, which may also be referred to herein as a polysilicon sheet. The polysilicon elements may comprise any polysilicon material known in the art, such as, but not limited to, doped or undoped polysilicon films. The polysilicon material may include a resistance which changes with temperature. The use of the polysilicon material may be advantageous for reducing the temperature coefficient, as compared to implementing the resistors in metallization layers of the integrated circuit. For example, the polysilicon material may include a temperature coefficient of resistance (TCR) of 160 parts per million per degrees Celsius (PPM/C), although this is not intended to be limiting. The polysilicon elements may each include a resistance value. For example, the polysilicon elements may each include a sheet resistance of 300 ohms per square, although this is not intended to be limiting. The polysilicon elements may be arranged in parallel and/or in series to form the resistor array for the polysilicon resistor with the select resistance value. In embodiments, the polysilicon elements are disposed below one or more metallization layers of the integrated circuit. The resistance (Rs), the resistance (Rt), and the resistance (Rb) may be based on the number and arrangement of the array of polysilicon elements. The number of resistor elements for the array used to form the resistor 114 may be substantially more than the number of resistor elements used to form the resistor 116, the resistor 118, the resistor 122, or the resistor 124, given that the resistance (Rs) is substantially less than the resistance (Rt) and the resistance (Rb). For example, there may be several thousand of the polysilicon elements in parallel to realize a 20 milli-ohm resistance value for the resistance (Rs).

The polysilicon elements may include a wide range of dimensions. For example, the polysilicon elements used to form the resistor 114, the resistor 116, or the resistor 118 may be relatively wide. For instance, the polysilicon elements may be 50 microns wide. The polysilicon elements may further include a length, such as, but not limited to, 4 microns. The aspect ratio of the polysilicon elements may thus be 50 microns by 4 microns. The polysilicon elements with an aspect ratio of 50 microns by 4 microns have been experimentally determined to include a temperature coefficient of 150 PPM/C. By way of another example, the polysilicon elements used to form the resistor 122 or the resistor 124 may be relatively narrow when compared to the polysilicon elements of the upstairs resistors and the sense resistor. For instance, the polysilicon elements of the downstairs resistors may be 1 micron wide. The polysilicon elements of the downstairs resistors may change over time due to aging. In embodiments, a variation in resistance of the downstairs resistance is further calibrated for by the calibration circuit 101. The calibration circuit 101 may track the shift in resistance over time, to provide additional calibration, thereby improving the accuracy of the current sense circuit.

One challenge with implementing the resistor 114 within the integrated circuit is a temperature coefficient and aging of the resistor 114. Integrating the upstairs resistors into the array of the resistor 114 may allow for cancellation of the temperature coefficient and aging for the resistance (Rs) and the resistance (Rt), thereby removing inaccuracies associated with the temperature of the upstairs resistor and the current sense resistor. The voltage (Vo) may be proportional to the current (Isns), the resistance (Rs), and the resistance (Rb). The voltage (Vo) may further be inversely proportional to the resistance (Rt). Undesirably, the voltage (Vo) may also include an error term to the temperature and age of the resistance (Rb). For example, an equation for the voltage (Vo) is provided below:

$$Vo = \frac{Isns * Rs * (1 + TC(\text{wide}) + Age(Rwide)) * Rb * (1 + TC(Rb) + Age(Rb))}{Rt * (1 + TC(\text{wide}) + Age(Rwide))}$$

In the above equation, the Isns may refer to the current across the resistor 114. In the above equation, Rs may refer to the resistance of the resistor 114 before being subject to aging and temperature. In the above equation, TCwide may refer to the temperature coefficient of the resistor 114, the resistor 116 and/or the resistor 118. In the above equation, Age(Rwide) may refer to the aging coefficient of the resistor 114, the resistor 116, and/or the resistor 118. In the above equation, Rb may refer resistance of the resistor 122 and/or the resistor 124 before being subject to aging and temperature. In the above equation, TC(RB) may refer to the temperature coefficient of the resistor 122 and/or the resistor 124. In the above equation, Age(Rb) may refer to the aging coefficient of the resistor 122 and/or the resistor 124. In the above equation, Rt may refer to the resistance of the resistor 116 and/or the resistor 118 before being subject to aging and temperature. Notably, the (1+TC(wide)+Age(Rwide) may be found in both the numerator and the denominator due to the configuration of the resistor 114, the resistor 116, and the resistor 118. The term wide is not intended to be limiting, but merely illustrates the resistor 114, the resistor 116, and/or the resistor 118 may each include a common width which may be wider than the resistor 122 and/or the resistor 124.

The voltage (Vo) may be affected by the age and temperature coefficient of the resistance (Rb). The resistance (Rb) may be increased by between 1 percent and 1.5 percent, or more, due to aging. Thus, the calibration circuit 101 may be advantageous to compensate for the 1 to 1.5 percent error and maintain detection of the current (Isns) within 1 percent error (i.e., at or below 1 percent error). An integrated circuit including the calibration circuit 101 and the current sense circuit 103 has been experimentally determined to include an accuracy within 0.5% of the actual current by calibrating for the aging of the resistor 122 and the resistor 124. The accuracy within 0.5% was for up to a dynamic current range between milliamps up to 2.5 amps with the resistance (Rs) at 20 milli-ohms.

In embodiments, one or more components of the calibration circuit 101 and one or more components of the current sense circuit 103 include a substantially similar temperature. To include a substantially similar temperature may mean the circuits and/or components to operate at and/or are subject to the substantially same temperature during operation. The resistor 104, the resistor 122, and the resistor 124 may include a substantially similar temperature. By maintaining the resistor 104, the resistor 122, and the resistor 124 at the same temperature, the resistance (Rb) for the resistors may include a similar error due to temperature. The calibration circuit 101 and the current sense circuit 103 may include any suitable structure for ensuring the uniform temperature. For example, the resistor 104, the resistor 122, and the resistor 124 may be interdigitated in a matrix in close proximity to one another for reducing a temperature differential between the resistor 104, the resistor 122, and the resistor 124. Thus, the aging and temperature for the resistor 104, the resistor 122, and the resistor 124 may be similar (i.e., (1+TC(Rb)+Age(Rb))==(1+TC(Rb)+Age(Rb)) from the above equations)

The transistor 126 and the transistor 128 may act as a second gain stage from the amplifier. If the amplifier 120 starts to detect a difference in voltage on the inputs, the output from the amplifier may pull up or pull down the gate of transistor 126 and the transistor 128, causing the transistors 126 and the transistor 128 to act as variable current sources. As may be understood, the transistor 126 and the transistor 128 may generally include any transistor, such as, but not limited to, a field-effect transistor such as a metal-oxide-semiconductor field-effect transistor (MOSFET or M). As depicted, the transistor 126 and the transistor 128 may be a P-channel MOS (PMOS), although this is not intended to be limiting.

Figure 2:
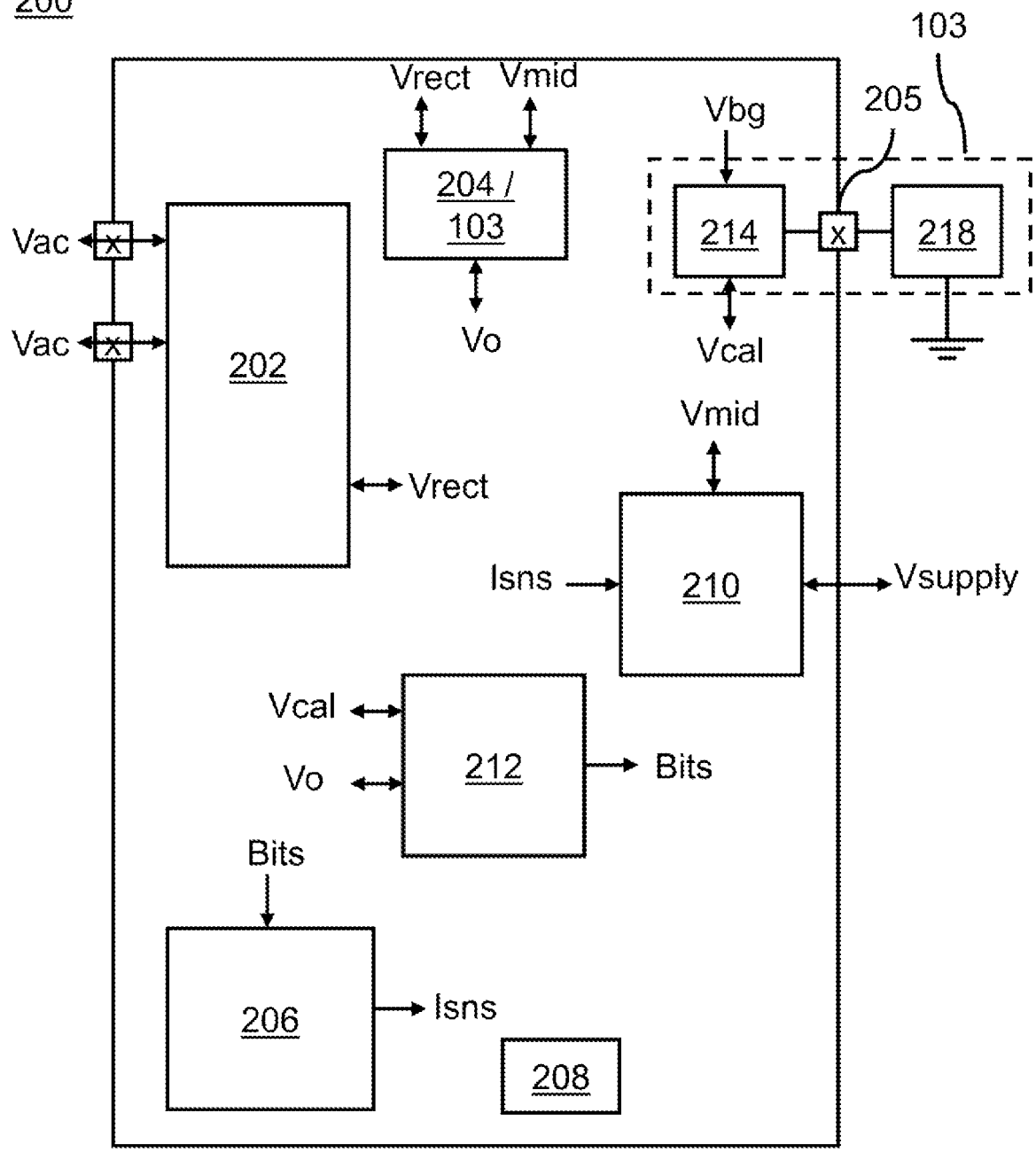
FIG. 2 depicts a simplified block diagram of an integrated circuit including a calibration circuit and a current sense circuit, in accordance with one or more embodiments of the present disclosure.

Referring now to FIG. 2, one exemplary embodiment of an integrated circuit 200 is described, in accordance with one or more embodiments of the present disclosure. The integrated circuit 200 may also be referred to herein as a transceiver unit, a mixed-signal chip, a wireless power chip, a wireless power receiver (Rx), a wireless power transmitter (Tx), a receiver (Rx) integrated circuit, or the like. The integrated circuit 200 may be configured to receive and condition alternating current and output a regulated DC voltage. For example, the alternating current may be received from a coil of a wireless power system and the regulated DC voltage may be provided to a battery for charging the battery, although this is not intended to be limiting. In embodiments, the integrated circuit 200 may include one or more of a rectifier 202, a current sense circuit 204, a processor 206, a power unit 208, a voltage regulator 210, an analog-to-digital converter 212, a calibration circuit 214, and the like. In embodiments, the integrated circuit 200 may include a pin 205 for coupling an external passive element 218 to the integrated circuit 200. It is further contemplated that the integrated circuit 200 may include any number of additional components which are not depicted herein in the interest of clarity. For example, the integrated circuit 200 may further include various traces between one or more of the rectifier 202, the current sense circuit 204, the embedded processor 206, the power unit 208, the voltage regulator 210, the analog-to-digital converter 212, the calibration circuit 214, and the pin 205 which are not depicted.

The rectifier 202 may be configured to receive an alternating current having a voltage (Vin). For example, the alternative current may be received from a coil of a wireless power system, although this is not intended to be limiting. The rectifier 202 may be further configured to generate a direct current having a voltage (Vrect). The voltage (Vrect) may be unregulated to a desired supply power. For example, the unregulated voltage may vary between different voltages. The rectifier 202 may generally include any suitable circuit for rectifying the current. For example, the rectifier 202 may include a bridge circuit, such as, an H-bridge circuit.

The rectifier 202 may convert an AC input voltage to a rectified DC voltage when the integrated circuit is configured in a receive mode. The rectifier may also convert a DC input voltage to an AC output voltage when the integrated circuit is configured in a transmit mode. For example, the integrated circuit may be configured in the receive mode for receiving wireless power. By way of another example the integrated circuit may be configured in the receive mode and/or the transmit mode for wireless communication with a transmitter.

The discussion of the current sense circuit 103 is incorporated herein by reference as to the current sense circuit 204. The current sense circuit 204 may include a voltage (Vrect) from a node and a voltage (Vmid) from a node. The voltage (Vrect) may be higher or lower than the voltage (Vmid) depending upon whether the integrated circuit 200 is receiving or transmitting. The current sense circuit 204 may further output a voltage (Vo) which may be used to determine the current (Isns).

The processor 206 may generally include any suitable processor. For example, the embedded processor 206 may be a microprocessor, although this is not intended to be limiting. The processor 206 may further include one or more blocks of memory, by which the processor 206 may be configured to execute any of the various methods described herein. For example, the processor 206 may include, but is not limited to, a read-only memory (ROM) for performing boot operations, one-time programmable (OTP) memory for start-up code, and/or random-access memory (e.g., static RAM) for maintaining program instructions, communications (e.g., FSK communications, ASK communications, etc.), and the like.

The processor 206 may generally be configured to execute various program functions which may be maintained in firmware. For example, the processor 206 may be configured to receive various bits from the analog-to-digital converter 212. The processor 206 may further be configured to determine a current (Isns) across the current sense circuit 204. In embodiments, the processor 206 is further configured to scale down the current (Isns) based on the voltage (Vcal) output from the calibration circuit 214 (e.g., based on the percent error). In this regard, the processor 206 may detect a percent error in the voltage (Vcal) corresponding to an increase in the resistance (Rb) due to aging of the resistor 104 and calibrates for the aging of the resistor 122 and/or the resistor 124 resistor by scaling down the current (Isns) according to the percent error. Scaling down may refer to reducing by a multiplicative factor.

The power unit 208 may be configured to power various components of the integrated circuit, such as, but not limited to, the embedded processor 206 or another component of the integrated circuit 200. The power unit 208 may generally provide any level of power, such as, but not limited to, 1.2 volts, 1.8 volts, 3.3 volts or 5 volts. The power unit 208 may draw power from any number of sources, such as, but not limited to, a main power rail of a communication device.

The voltage regulator 210 may be configured receive the voltage (Vmid) from the current sense circuit 204. The voltage regulator 210 may further be configured to regulate the voltage to a desired output. The regulated voltage may then be provided to a battery or a battery charging system for charging the battery. The regulated voltage may generally include any suitable output voltage for wireless charging, such as, but not limited to, 15 volts or 30 volts.

The analog-to-digital converter 212 may be configured to receive various voltage and/or currents from any one or more of the components of the integrated circuit and generate a digital signal of bits. For example, the analog-to-digital converter 212 may receive the voltage (Vo) from the current sense circuit 204 and/or the voltage (Vcal) from the calibration circuit 214 and generate the digital signal based on the voltage (Vo) and the voltage (Vcal). The analog-to-digital converter 212 may then provide the digital signal to the processor 206 for processing. As may be understood, the analog-to-digital converter 212 may generally include any analog-to-digital converter (ADC), and may further include multiple for handling various other converter various other signals, which are not depicted herein.

The discussion of the calibration circuit 101 is incorporated herein by reference as to the calibration circuit 214. The calibration circuit 214 may be configured to receive a band-gap voltage (Vbg). The calibration circuit 214 may be further coupled to the external passive element 218 by the pin 205. The pin 205 may also be referred to herein as a chip pin, a pin out, and the like. The calibration circuit 214 may be further configured to output a voltage (Vcal) for calibrating one or more resistors of the current sense circuit 204. Once the external passive element 218 is coupled to the pin 205, an initial calibration voltage (Vint) may be received at time t=0 and stored in non-volatile memory (e.g., RRAM or OTP). Periodically, the processor 206 may then execute program instructions maintained in memory (e.g., firmware) to remeasure the voltage (Vcal) and compare to the voltage (Vint) for calibrating the current (Isns).

Although the current sense circuit 204 and the calibration circuit 214 are described as being a component of the integrated circuit 200, this is not intended as a limitation of the present disclosure. It is contemplated that the current sense circuit 103 and/or the current sense circuit 204 together with the calibration circuit 101 and/or the calibration circuit 214 may be integrated into any number of integrated circuits. In this regard, current sensing and aging calibration may be advantageous in any number of integrated circuits for providing a precision current measurement over a wide dynamic range. The application may include any type of precision current measurement on a chip, such as a wireless power system or for any type of power management type of integrated circuits.

Figure 3:
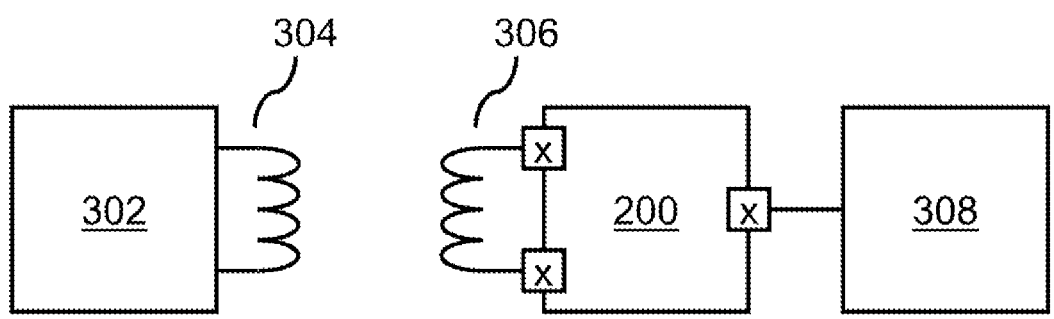
FIG. 3 depicts a simplified schematic of a wireless power system, in accordance with one or more embodiments of the present disclosure.

Referring now to FIG. 3, a wireless power system 300 is described in accordance with one or more embodiments of the present disclosure. The wireless power system 300 may include one or more components, such as, but not limited to, a transmitter unit 302, a transmitter coil 304, a receiver coil 306, the integrated circuit 200, and a battery charger 308. The transmitter unit 302 and the integrated circuit 200 may be inductively coupled by the transmitter coil 304 and the receiver coil 306. In this regard, the integrated circuit 200 may receive power wirelessly from the transmitter unit 302 and provide the power to the battery charger 308 for charging one or more batteries. The integrated circuit 200 and the transmitter unit 302 may wirelessly communicate by any number of communication protocol. For example, the integrated circuit 200 may receive transmit and receive communications to the transmitter unit 302 to establish a transmission by one or more handshake protocols. The current sense circuit may be configured to sense the current (Isns) in either transmit mode or receive mode.

Providing a high accuracy current measurement from the current sense circuit within the integrated circuit 200 is advantageous to help with foreign object detection. The more accurate the current sense, a more accurate power transfer in the system 300 may be performed. Power transfer levels for the wireless power system 300 has increased over time. Accurate current sense becomes increasingly important as the power levels increase. Sensing current internally without using external resistors within the current sense circuit is also advantageous.

Figure 4:
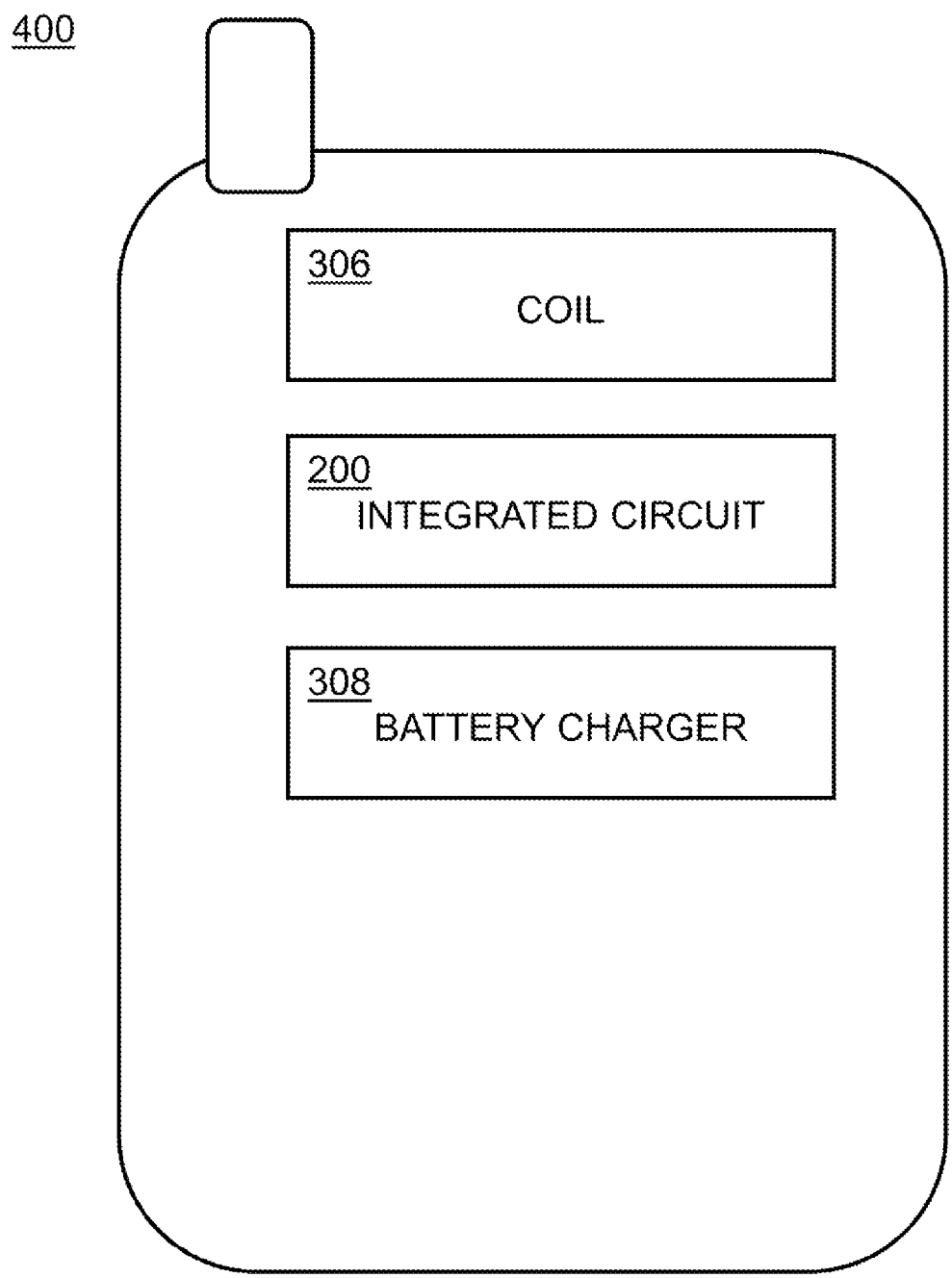
FIG. 4 depicts a simplified communication device including one or more components of a wireless power system, in accordance with one or more embodiments of the present disclosure.

Referring now to FIG. 4, a communication device 400 is described in accordance with one or more embodiments of the present disclosure. The communication device 400 may generally include one or more components of the wireless power system 300, by which the battery may be wirelessly charged. Peak wireless power transfer levels for the communication device 400 may range from 15 to 30 watts, or more, and may further increase with advances in wireless power transfer protocols and hardware. Improved accuracy in the ability to sense current within the wireless power system 300 becomes increasingly important as the peak wireless power transfer levels increase. The communication device 400 may generally include any type of device configured to communicate by transmitting or receiving a signal (e.g., digital, analog, etc.) over a medium (e.g., wired, wireless, etc.), such as, but not limited, a cellular phone, a modem, a network interface, and the like. In some instances, the communication device 400 is configured to communicate by the wireless power system, such as for communicating between a transmitter and receiver.

Referring generally again to FIGS. 1A-4, for the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors may include any device configured to execute algorithms and/or instructions (e.g., program instructions stored in memory). Furthermore, the memory may include any storage medium known in the art suitable for storing program instructions executable by the associated processor. For example, the memory medium may include a non-transitory memory medium. By way of another example, the memory medium may include, but is not limited to, a read-only memory (ROM), a random-access memory (RAM), a magnetic or optical memory device (e.g., disk), a solid-state drive and the like. It is further noted that memory medium may be housed in a common controller housing with the processor. In embodiments, the memory medium may be located remotely with respect to the physical location of the processor.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed:

1. An integrated circuit comprising:
a first circuit including a first amplifier, a first resistor, a second resistor, a third resistor, a fourth resistor, and a fifth resistor; wherein the first resistor has a first resistance (Rs); wherein the second resistor and the third resistor each have a second resistance (Rt); wherein the fourth resistor and the fifth resistor each have a third resistance (Rb); wherein the first resistor is configured to carry a first current (Isns) which is based on the first resistance (Rs) and a voltage differential between a first voltage (Vrect) and a second voltage (Vmid); wherein the first amplifier is configured to output a third voltage (Vo) based of the current (Isns); wherein a gain of the first amplifier is based on the second resistance (Rt) and the third resistance (Rb); wherein at least the fourth resistor and the fifth resistor are comprised of a polysilicon material; wherein the third resistance (Rb) increases with aging of the fourth resistor and the fifth resistor;

a second circuit including a sixth resistor comprised of the polysilicon material; wherein the sixth resistor has the third resistance (Rb); wherein the second circuit is configured to output a fourth voltage (Vcal) which is proportional to the third resistance (Rb); and a processor; wherein the processor is configured to receive one or more digital signals of the third voltage (Vo) and the fourth voltage (Vcal); wherein the processor is configured to determine the current (Isns) based on the third voltage (Vo); wherein the processor is configured to calibrate for the aging of the fourth resistor and the fifth resistor based on the fourth voltage (Vcal) when determining the first current (Isns).

2. The integrated circuit of claim 1, wherein the second circuit further comprises:
a pin configured to couple to an external passive element; wherein the external passive element is coupled between the pin and ground; and
a second amplifier configured to generate a second current (Ical) across the external passive element; wherein the second circuit is configured to mirror the second current (Ical) across the sixth resistor.

3. The integrated circuit of claim 2, wherein the second circuit includes a first transistor and a second transistor for mirroring the second current (Ical) across the sixth resistor.

4. The integrated circuit of claim 1, wherein the processer includes a memory with an initial voltage (Vint) output from the second circuit; wherein the processor is configured to compare the fourth voltage (Vcal) to the initial voltage (Vint) to detect a percent error in the fourth voltage (Vcal) corresponding to an increase in the third resistance (Rb) due to aging of the sixth resistor; wherein the processor is configured to calibrate for the aging of the fourth resistor and the fifth resistor by scaling down the first current (Isns) according to the percent error.

5. The integrated circuit of claim 1, wherein the fourth resistor, the fifth resistor, and the sixth resistor are placed in a same layer to reduce a temperature differential between the fourth resistor, the fifth resistor, and the sixth resistor.

6. The integrated circuit of claim 1, wherein the first resistor is coupled between a first node with the first voltage (Vrect) and a second node with the second voltage (Vmid); wherein the second resistor is coupled between the first node and a first input of the amplifier; wherein the third resistor is coupled between the second node and a second input of the amplifier; wherein the fourth resistor is coupled between a first output of the amplifier and ground; wherein the fifth resistor is coupled between a second output of the amplifier and ground.

7. The integrated circuit of claim 6, wherein the gain of the amplifier is proportional to third resistance (Rb) and inversely proportional to the second resistance (Rt); wherein the third voltage (Vo) is proportional to the first current (Isns), the first resistance (Rs), and the third resistance (Rb); wherein the third voltage (Vo) is inversely proportional to the second resistance (Rt).

8. The integrated circuit of claim 7, wherein each of the first resistor, the second resistor, and the third resistor are comprised of the polysilicon material; wherein the gain of the first amplifier and the third voltage (Vo) is independent to changes in the first resistance (Rs) and the second resistance (Rt) due to aging.

9. The integrated circuit of claim 8, wherein the third resistance (Rb) is configured to increase by up to 1.5 percent due to aging of the third resistor and the fourth resistor; wherein, by calibrating for the aging of the fourth resistor and the fifth resistor, the processor is configured to determine the first current (Isns) within 0.5 percent of an actual value when the third resistance (Rb) has increased by 1.5 percent.

10. The integrated circuit of claim 8, wherein the first resistor, the second resistor, and the third resistor are disposed in a same layer of the integrated circuit for reducing a temperature differential between the first resistor, the second resistor, and the third resistor.

11. The integrated circuit of claim 1, further comprising at least one analog-to-digital converter configured to convert the third voltage (Vo) to a first digital signal and the fourth voltage (Vcal) to a second digital signal and provide the first digital signal and the second digital signal to the processor.

12. The integrated circuit of claim 1, further comprising a rectifier and a voltage regulator; wherein the rectifier is configured to receive alternating current received from a coil, rectify the alternating current, and output the first voltage (Vrect); wherein the voltage regulator is configured to regulate the second voltage (Vmid).

13. The integrated circuit of claim 1, wherein the amplifier comprises a differential amplifier.

14. The integrated circuit of claim 1, wherein a change in the third resistance (Rb) due to aging is substantially similar for the fourth resistor, the fifth resistor, and the sixth resistor.

15. A wireless power system comprising:
a coil;
an integrated circuit comprising:
a rectifier configured to receive alternating current from the coil and generate a first voltage (Vrect);
a first circuit including a first amplifier, a first resistor, a second resistor, a third resistor, a fourth resistor, and a fifth resistor; wherein the first resistor has a first resistance (Rs); wherein the second resistor and the third resistor each have a second resistance (Rt); wherein the fourth resistor and the fifth resistor each have a third resistance (Rb); wherein the first resistor is configured to carry a first current (Isns) which is based on the first resistance (Rs) and a voltage differential between a first voltage (Vrect) and a second voltage (Vmid); wherein the first amplifier is configured to output a third voltage (Vo) based of the current (Isns); wherein a gain of the first amplifier is based on the second resistance (Rt) and the third resistance (Rb); wherein at least the fourth resistor and the fifth resistor are comprised of a polysilicon material; wherein the third resistance (Rb) increases with aging of the fourth resistor and the fifth resistor;
a voltage regulator configured to regulate the second voltage (Vmid);
a second circuit including a sixth resistor comprised of the polysilicon material; wherein the sixth resistor has the third resistance (Rb); wherein the second circuit is configured to output a fourth voltage (Vcal) which is proportional to the third resistance (Rb); and
a processor; wherein the processor is configured to receive one or more digital signals of the third voltage (Vo) and the fourth voltage (Vcal); wherein the processor is configured determine the current (Isns) based on the third voltage (Vo); wherein the processor is configured to calibrate for the aging of the fourth resistor and the fifth resistor based on the fourth voltage (Vcal) when determining the first current (Isns);
a passive element disposed external to the integrated circuit and coupled to the pin; wherein the passive element is coupled between the pin and ground; and
a battery charging system.

16. The wireless power system of claim 15, wherein the wireless power system is configurable between a receive mode and a transmit mode; wherein the first current (Isns) is provided from the rectifier, across the first resistor, and to the voltage regulator when the wireless power system is in the receive mode; wherein the processor is configured to determine the first current (Isns) when the wireless power system is in the receive mode.

17. The integrated circuit of claim 15, wherein the amplifier comprises a differential amplifier.

18. A circuit comprising:
a pin;

a passive element coupled to the pin; wherein the passive element is coupled between the pin and ground;

a first resistor comprising a polysilicon material; wherein the first resistor has a first resistance (Rb) which increases with aging of the polysilicon material; and an amplifier configured to receive a bandgap voltage (Vbg) and generate a current (Ical) across the passive element; wherein the circuit is further configured to mirror the current (Ical) across the first resistor; wherein the circuit is configured to output a first voltage (Vcal) which is based on the bandgap voltage (Vbg), the first resistance (Rb), and the passive element.

19. The circuit of claim 18, wherein the passive element is a thin film chip resistor; wherein the thin film chip resistor has a second resistance (Rext); wherein the first voltage (Vcal) is inversely proportional to the second resistance (Rext).

20. The circuit of claim 18, wherein the passive element is a capacitor coupled to the pin.

* * * * *